United States Patent
Hsiao et al.

(10) Patent No.: US 12,464,936 B2
(45) Date of Patent: Nov. 4, 2025

(54) OPTICAL STACK AND ORGANIC LIGHT EMITTING DIODE DISPLAY INCLUDING STORAGE MODULUS OF ADHESIVE LAYERS

(71) Applicant: TPK ADVANCED SOLUTIONS INC., Xiamen (CN)

(72) Inventors: Po-Yu Hsiao, Taoyuan (TW); Sheng-Fa Liu, Taoyuan (TW); Yi-Lung Yang, Taoyuan (TW); Wei-Chou Chen, Taoyuan (TW); Ming-Chung Liu, Miaoli County (TW); Ya-Chin Chang, Taichung (TW); Che-Wei Yen, Taoyuan (TW); Ho-Chien Wu, New Taipei (TW)

(73) Assignee: TPK ADVANCED SOLUTIONS INC., Xiamen (CN)

(*) Notice: Subject to any disclaimer, the term of this patent is extended or adjusted under 35 U.S.C. 154(b) by 780 days.

(21) Appl. No.: 17/730,159

(22) Filed: Apr. 26, 2022

(65) Prior Publication Data

US 2023/0345761 A1    Oct. 26, 2023

(51) Int. Cl.
*H10K 59/80* (2023.01)
*G02B 5/30* (2006.01)
(Continued)

(52) U.S. Cl.
CPC ......... *H10K 59/8793* (2023.02); *G02B 5/305* (2013.01); *H10K 59/40* (2023.02);
(Continued)

(58) Field of Classification Search
CPC .. H10K 50/868; H10K 50/8426; H10K 59/40; H10K 59/8791; H10K 59/12;
(Continued)

(56) References Cited

U.S. PATENT DOCUMENTS 9,064,826 B2 * 6/2015 Nakazawa ............... G09F 9/00
2012/0113361 A1 * 5/2012 Huang .................... G06F 3/041
428/431

(Continued)

FOREIGN PATENT DOCUMENTS

CN    111316144 B  *  1/2023  ........... G02B 5/3025
JP    2021157146 A  * 10/2021  ............... G02B 5/30
(Continued)

OTHER PUBLICATIONS

Office Action of corresponding Taiwan patent application No. 111113483 mailed on Feb. 8, 2023.

*Primary Examiner* — Ida M Soward
(74) *Attorney, Agent, or Firm* — Idea Intellectual Limited; Sam T. Yip (57) ABSTRACT

The present invention relates to an optical stack and an organic light emitting diode display including the optical stack, wherein the optical stack has an adhesive layer. The adhesive layer is disposed between a cover plate and a circular polarizer component, between the circular polarizer component and a touch component, or between the touch component and a display component. Wherein, a storage modulus at 60° C. of the adhesive layer is between 15 kPa (Continued)

and 30 kPa, and a ratio of a storage modulus at −30° C. to the storage modulus at 60° C. of the adhesive layer is between 6 and 16.

18 Claims, 3 Drawing Sheets

(51) Int. Cl.
  *H10K 59/40* (2023.01)
  *G02F 1/1333* (2006.01)
  *G09F 9/30* (2006.01)
  *H10K 59/12* (2023.01)
  *H10K 77/10* (2023.01)
(52) U.S. Cl.
  CPC ... *H10K 59/8722* (2023.02); *G02F 1/133331* (2021.01); *G09F 9/301* (2013.01); *H10K 59/12* (2023.02); *H10K 77/111* (2023.02)
(58) Field of Classification Search
  CPC . H10K 77/111; G02B 5/305; G02F 1/133305; G09F 9/301
  See application file for complete search history.

(56) References Cited

U.S. PATENT DOCUMENTS

| | | | | |
|---|---|---|---|---|
| 2014/0370316 | A1* | 12/2014 | Mizuta | C09J 133/08 522/18 |
| 2019/0086709 | A1* | 3/2019 | Lee | G02F 1/133308 |
| 2020/0192510 | A1* | 6/2020 | Liu | B32B 15/082 |
| 2020/0313121 | A1* | 10/2020 | Kuo | H10K 59/8791 |
| 2021/0139747 | A1* | 5/2021 | Du | H10K 59/40 |

FOREIGN PATENT DOCUMENTS

| | | | | | |
|---|---|---|---|---|---|
| KR | 20150143715 A | * | 12/2015 | | C09J 163/00 |
| KR | 20160065030 A | | 6/2016 | | |
| KR | 20190109272 A | * | 9/2019 | | G02B 5/3041 |
| KR | 20200086666 A | * | 7/2020 | | H10K 50/00 |
| KR | 20200098418 A | * | 8/2020 | | G09F 9/33 |
| TW | 201633088 A | | 9/2016 | | |
| TW | I590119 B | | 7/2017 | | |
| TW | 202030296 A | | 8/2020 | | |
| WO | WO-2013065587 A1 | * | 5/2013 | | H10K 59/8722 |

* cited by examiner

OPTICAL STACK AND ORGANIC LIGHT EMITTING DIODE DISPLAY INCLUDING STORAGE MODULUS OF ADHESIVE LAYERS

FIELD OF THE INVENTION

The present invention relates to a flexible optical stack and an organic light emitting diode display comprising the same, and more particularly, to an ultra-thin optical stack with stable flexibility and an organic light emitting diode display comprising the same.

BACKGROUND OF THE INVENTION

At present, circular polarizer (CPOL) is mainly formed by combining a phase retardation layer (retarder) and a linear polarizer. In the field of displays, display devices usually are combined with an electrical signal processing element (for example, touch sensing electrodes) and optical elements (for example, optical films such as polarizing films, phase retardation films) to meet the application requirements of end users, while the electrical signal processing element and the optical element are usually bonded with each other through optically clear adhesive. However, since the usage environment, storage environment and/or manufacturing environment of display devices have recently become more severe, and applications in flexible display devices have become more completely developed, it is necessary to consider coordination of the characteristics of respective film layers in the display device. In particular, in order to apply the display device as a flexible aspect, the aforementioned optically clear adhesive plays an important role. For example, the optically clear adhesive may absorb stress when the display device is in a bent state, so as to avoid failures of the aforementioned electrical signal processing element or optical element.

Taiwan Patent No. I590119 (hereinafter referred to as Patent I590119) discloses a flexible display device, in which a photoelectric element part and a touch function part are combined through a first adhesive film, and the touch function part and a window film are combined through a second adhesive film.

In Patent I590119, the adhesive film of the flexible display device has been disclosed, and the storage modulus of the adhesive film has been discussed. For example, the analytical results show that the storage modulus of the adhesive film has an average slope of −9.9 to 0 within a temperature range of −20° C. to 80° C., and the storage modulus at 80° C. of the adhesive film is 10 kPa to 1000 kPa. However, in Patent I590119, only tensile tests are performed, this cannot effectively verify the state of the adhesive film under bent/folded situation. That is, Patent I590119 cannot provide an adhesive material suitable for bendable/flexible/rollable products, especially at low temperature (e.g., about −30° C. to about −20° C.). Therefore, how to find a preferable specification criterion such that the adhesive film can be suitable for both high and low temperature environments (e.g., about −30° C. to about 60° C.) is an urgent problem to be solved.

Hence, the present invention has been developed in view of the above-mentioned disadvantages.

SUMMARY OF THE INVENTION

An objective of the present invention is to provide a flexible optical stack, wherein the optical stack comprises at least one adhesive layer, and the optical stack is formed by integrating an electrical signal processing element and optical elements. By disposing the adhesive layer, these two components with different characteristics/functions can be used in coordination without compromising their respective characteristics. Meanwhile, the present invention can thin the product to meet the integration requirement, thereby realizing a bendable ultra-thin optical stack and products comprising the optical stack.

Another objective of the present invention is to provide a flexible optical stack, wherein a storage modulus at 60° C. of the adhesive layer ranges from 15 kPa to 30 kPa, and a ratio of a storage modulus at −30° C. to the storage modulus at 60° C. of the adhesive layer ranges from 6 to 16. Thereby, an adhesive layer capable of maintaining viscoelasticity and having excellent recoverability e.g., from a bent state back to a normal/un-bent state within a wide temperature range can be realized.

The flexible optical stack according to the present invention comprises at least one adhesive layer, which is disposed between a cover plate and a circular polarizer component, between the circular polarizer component and a touch component, or between the touch component and a display component. The storage modulus at 60° C. of the adhesive layer ranges from 15 kPa to 30 kPa, and the ratio of the storage modulus at −30° C. to the storage modulus at 60° C. of the adhesive layer ranges from 6 to 16.

In an embodiment of the present invention, in the optical stack according to the present invention, the storage modulus at 60° C. of the adhesive layer is 27 kPa, and the ratio of the storage modulus at −30° C. to the storage modulus at 60° C. of the adhesive layer is 6.6.

In an embodiment of the present invention, in the optical stack according to the present invention, the storage modulus at 60° C. of the adhesive layer is 17 kPa, and the ratio of the storage modulus at −30° C. to the storage modulus at 60° C. of the adhesive layer is 15.8.

In an embodiment of the present invention, in the optical stack according to the present invention, the storage modulus at 60° C. of the adhesive layer is 28 kPa, and the ratio of the storage modulus at −30° C. to the storage modulus at 60° C. of the adhesive layer is 13.3.

In an embodiment of the present invention, in the optical stack according to the present invention, a glass transition temperature of the adhesive layer is lower than −30° C.

In an embodiment of the present invention, in the optical stack according to the present invention, the adhesive layer is made of a material including a hydroxyl-containing acrylic-based polymer.

In an embodiment of the present invention, in the optical stack according to the present invention, an interfacial adhesion between the adhesive layer and the circular polarizer component is greater than 500 g/inch within a temperature range from −30° C. to 60° C.

Furthermore, the present invention further provides an organic light emitting diode display with stable flexibility applying the above-mentioned optical stack. The organic light emitting diode display comprises: a cover plate; a circular polarizer; a touch component; a display component; a first adhesive layer disposed between the cover plate and the circular polarizer component; a second adhesive layer disposed between the circular polarizer component and the touch component; and a third adhesive layer disposed between the touch component and the display component. The cover plate is disposed at an uppermost layer of the organic light emitting diode display. A storage modulus at 60° C. of each of the first, second and third adhesive layers ranges independently from 15 kPa to 30 kPa. A ratio of a storage modulus at −30° C. to the storage modulus at 60° C. of each of the first, second and third adhesive layers ranges independently from 6 to 16.

The flexible optical stack provided in the present invention comprises at least one adhesive layer, and the optical stack is formed by integrating an electrical signal processing element and optical elements. By disposing the adhesive layer, these two components with different characteristics/functions can be used in coordination without compromising their respective characteristics. Meanwhile, the present invention can thin the product to meet the integration requirement, thereby realizing a bendable ultra-thin optical stack and products comprising the optical stack. In addition, a storage modulus at 60° C. of the adhesive layer ranges from 15 kPa to 30 kPa, and a ratio of a storage modulus at −30° C. to the storage modulus at 60° C. of the adhesive layer ranges from 6 to 16. According to this, the adhesive layer can be ensured to reach an excellent balance between the cohesive strength and the adhesive strength. Therefore, an adhesive layer capable of maintaining viscoelasticity and having excellent recoverability within a wide temperature range can be realized, thereby achieving excellent reliability and durability.

In order to support the understanding of those skilled in the art in terms of the purpose, features and effects of the present invention, the following specific embodiments and the accompanying drawings are provided to describe the present invention in detail.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENTS

Hereinafter, the advantages, features and achieving methods of the present invention will be apparent by the following detailed description of exemplary embodiments of the present invention with reference to the accompanying drawings. It should be noted, however, that the present invention is not limited to the following exemplary embodiments, but may be implemented in various forms.

The terminology used herein is for describing particular embodiments only, but not intended to limit the present invention. As used herein, the singular expressions "a" and "the" also include the plural expressions unless it is clearly indicated otherwise in the context.

In addition, it should be understood that when an element is located "on" another element, it can be directly located on the other element, or an interposed element may present. Further, the thickness values referred herein are not fixed values, and those skilled in the art can understand that there may be manufacturing tolerances, measurement errors, etc. therein. Preferably, there may be error ranges of 10%, 20% in the thicknesses listed herein.

It should also be understood that, although the terms such as "first", "second" may be used herein to describe various elements, these elements should not be limited by these terms. These terms are used to distinguish respective elements only. Therefore, a first element in some embodiments may be referred to as a second element in other embodiments without departing from the teachings of the present invention. In the present specification, the same reference numerals denote the same elements. Furthermore, terms such as "plate", "layer", "film", or other similar terms are used interchangeably herein to referring the optical elements, and there are only differs from each other literally, unless it is indicated otherwise herein.

Figure 1:
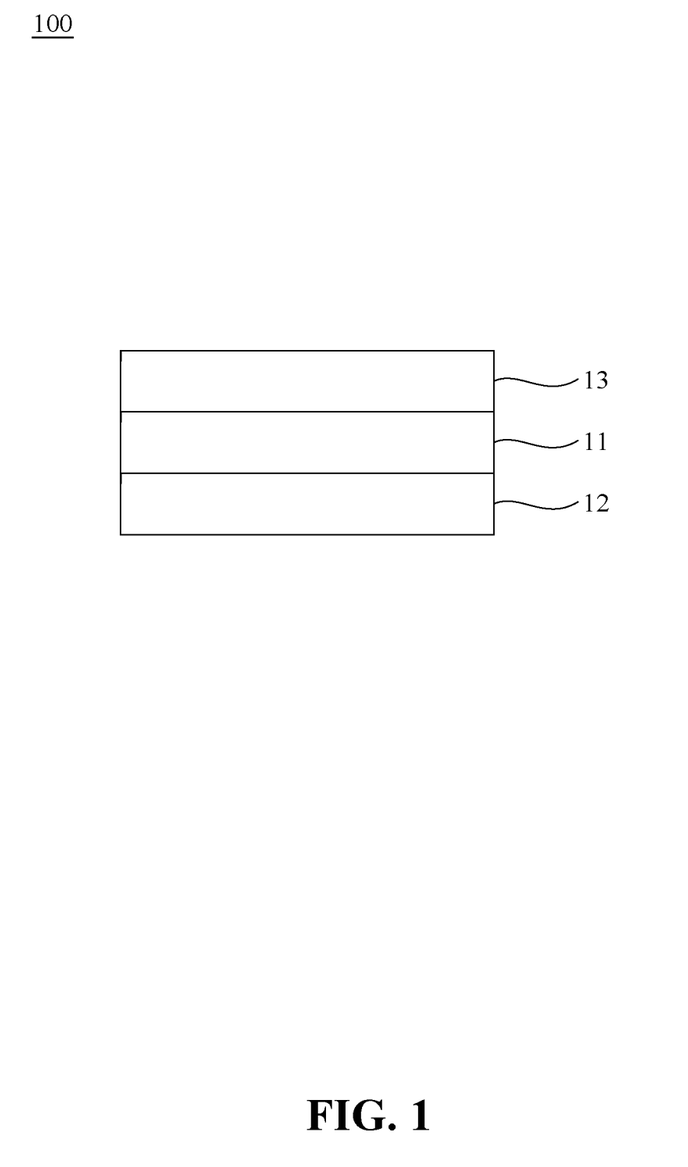
FIG. 1 is a schematic diagram illustrating an exemplary optical stack according to the present invention.

FIG. 1 illustrates an exemplary optical stack 100 according to the present invention. The flexible optical stack 100 comprises at least one adhesive layer 11. The adhesive layer 11 may be disposed between substrates 12 and 13. In the present invention, the substrates 12 and 13 may be any one of a cover plate, a circular polarizer component, a touch component, a display component, etc. For example, the adhesive layer 11 may be disposed between a cover plate (i.e., the substrate 13), which performs as a touch surface of a mobile device, and a circular polarizer component (i.e., the substrate 12). Alternatively, in another embodiment, the adhesive layer 11 may be disposed between a circular polarizer component (i.e., the substrate 13) and a touch sensing component (i.e., the substrate 12). Alternatively, in another embodiment, the adhesive layer 11 may be disposed between a touch sensing component (i.e., the substrate 13) and a display component (i.e., the substrate 12). The above descriptions are for exemplary purposes only, but not intended to limit the present invention. Due to the characteristics of the adhesive layer 11 according to the present invention, a bendable ultra-thin integrated touch module and products comprising the touch module can be realized by two or more layers of components under a wide range of operating temperature (such as temperature ranges from about −30° C. to about 60° C.).

Specifically, according to some embodiments, the adhesive layer 11 may be an optically clear adhesive (OCA), which may be made of a material including a hydroxyl-containing acrylic-based polymer. Specifically, in some embodiments, the adhesive layer 11 may be made of materials including at least one of alkyl (meth)acrylate monomers, monomers containing ethylene oxide, monomers containing propylene oxide, monomers containing amino group, monomers containing amide group, monomers containing alkoxy group, monomers containing phosphoric acid group, monomers containing sulfonic acid group, monomers containing phenyl group, and monomers containing silanyl group. More specifically, a glass transition temperature of the adhesive layer 11 may be lower than or equal to −30° C.

In addition, in some embodiments of the present disclosure, the circular polarizer component may be an anti-reflection optical element consisting of a combination of at least one phase retardation layer and at least one linear polarization layer. In order to achieve the purposes of the aforementioned integration and product thinning, in one embodiment of the present invention, the phase retardation layer can be selected from a cyclic olefin polymer (COP) with a thickness of 45 μm, which can be used as a quarter wave phase compensation layer (also referred to as quarter wave retarder or quarter wave plate, QWP). Furthermore, in some embodiments of the present disclosure, the linear polarization layer can be a generally commercially available polarization plate with a degree of polarization (DOP) greater than 98%, but is not limited thereto. The linear polarization layer can be a combination in which a polyvinyl alcohol (PVA) material is fixed between two protective films (such as triacetate cellulose, TAC) (hereinafter referred to as A-type polarization layer). Alternatively, the linear polarization layer can be a polyvinyl alcohol (PVA) material with a single sided protective film (such as TAC) (hereinafter referred to as B-type polarization layer). The above two types of polarization layers or any polarization layers in other forms/stackup are suitable for the present invention, which is not limited to the embodiments. In one embodiment of the present invention, the phase retardation layer may be a combination of a quarter wave phase compensation layer and a half wave phase compensation layer (also referred to as half wave retarder or half wave plate, HWP). In one embodiment of the present invention, the phase retardation layer may be a half wave phase compensation layer. In the embodiments of the present invention, the characteristics of the optical film will be described by the phase retardation value measured at the plane perpendicular to the thickness direction of the testing object (that is, in-plane retardance/retardation ($R_O$)). In the embodiments of the present invention, commercial equipment with a model number of AxoScan (available from Axometrics, Inc) is used for measuring the in-plane phase retardation value of the testing object within the wavelength range of visible light.

It should be further noted that, since the present invention relates to the storage modulus of the adhesive layer 11, the measurement method thereof will be described below. The storage modulus can be measured by performing a dynamic load test/dynamic mechanical analysis (DMA) on the adhesive layer 11. The basic principle of which includes applying a periodic stress with certain frequency on the adhesive layer 11, analyzing the magnitude of the strain and the phase difference between the applied dynamic force and the deformation of the adhesive layer 11, and thereby obtaining the dynamic properties of the material, such as stiffness (i.e., storage modulus) and damping (i.e., loss modulus). In order to simulate the stressed mode of the material under actual working conditions, the waveform of the dynamic stress can be sine wave, triangular wave, and square wave, etc. For example, when stress is applied to the material, the ratio of stress to strain is a complex modulus, and the phase difference between both of them can be defined as a phase angle δ, which represents the lag degree of the material deformation. It should be further noted that the complex modulus is in complex coordinates, the angle between the complex modulus and the x-axis is the phase angle δ, the storage modulus and the loss modulus are projections of the complex modulus on the real and imaginary axes, respectively, and tan δ is defined as the loss factor to represent the loss characteristic of the adhesive layer 11.

Figure 2:
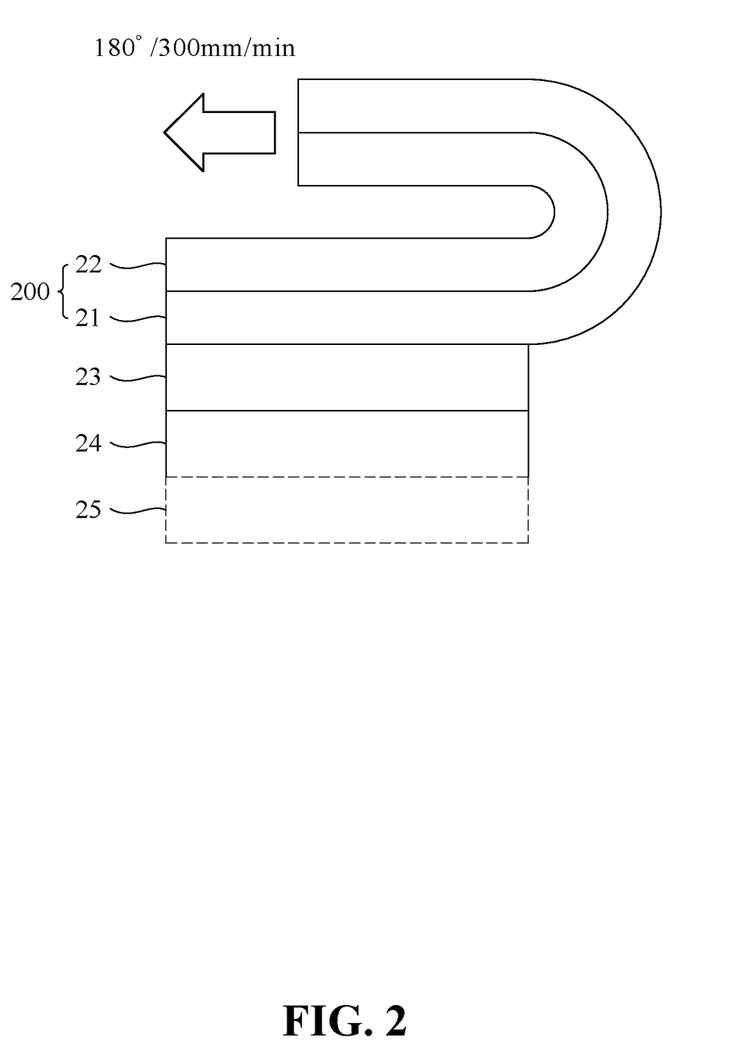
FIG. 2 is an exemplary schematic diagram illustrating the optical stack under a peel strength test.

It is noted that, since the present invention relates to the peel strength (also referred to as interfacial adhesion) between the adhesive layer 11 and the above-mentioned different components/substrates, the measurement method thereof will be described below. Referring to FIG. 2, which is an exemplary schematic diagram illustrating the optical stack under a peel strength test. First, the adhesive composition to be tested is coated on a leader tape 22 (which is made of a material of polyethylene terephthalate (PET) film), and a first adhesive film 21 is formed after the adhesive composition is cured. The first adhesive film 21 and the leader tape 22 are combined with each other to constitute an adhesive sheet 200, wherein the leader tape 22 has a thickness of 50 μm. Then, the sample 23 is bonded to the other side of the first adhesive film 21 to form an adhesive interface. The sample 23 may be chosen of any one of a cover plate, a circular polarizer component, a touch component, and a display component, etc., and the user can replace the sample 23 with different components for testing according to requirements. In addition, the sample 23 can be fixed on glass 25 through the second adhesive film 24. Finally, the adhesive sheet 200 is inversely folded by 180° at one side, and a pulling force is applied to pull the adhesive sheet 200 at a rate of 300 mm/min under different temperature environments. Thereby, the peel strengths of the adhesive interface formed between the testing adhesive composition and the sample 23 under different temperature environments are measured. It is noted that, since the first adhesive film 21 and the second adhesive film 24 are formed of the same adhesive composition, no matter whether the interface peeling occurs between the first adhesive film 21 and the sample 23, or between the sample 23 and the second adhesive film 24, the measured peel strength can be regarded as the peel strength between the testing adhesive composition and the sample 23.

Figure 3:
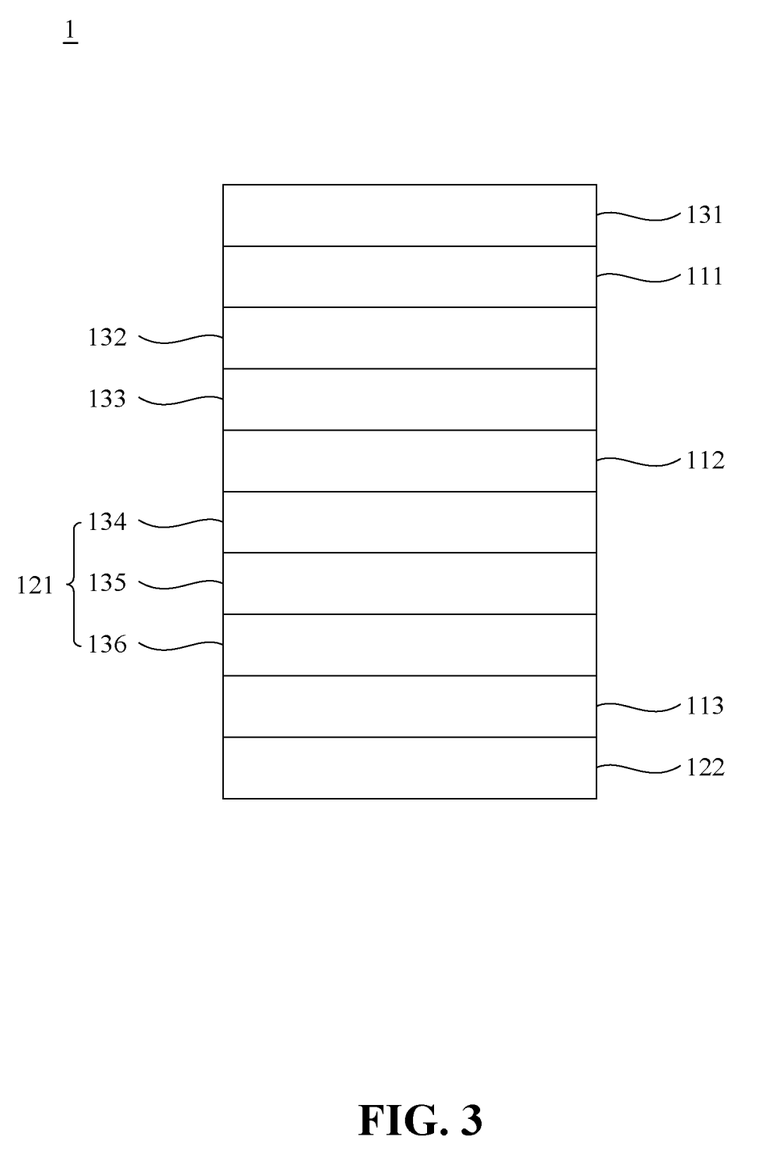
FIG. 3 is an exemplary schematic diagram illustrating the optical stack under a bending test.

It should be further noted that, since the present invention relates to the bending test of the adhesive layer 11 with different substrates, the measurement method thereof will be described below. As used herein, the term "passing the bending test" means that the testing object go through the following procedure without the occurrence of the following failure behavior. Referring to FIG. 3, which is an exemplary schematic diagram illustrating the optical stack under a bending test. The bending test described in the present invention is mainly performed on the testing optical stack (illustrated in FIG. 3), and the main purpose of which is to confirm whether the testing optical stack, which is used for simulating an actual touch display device, can pass the bending test. Therefore, when performing the bending test, the main purpose is to evaluate the bending feasibility of the testing optical stacks using different optical adhesive materials under different temperature environments, while the structures of respective layers therein will be described in detail later. The method for bending test includes performing at least 200,000 times of bending tests on the testing optical stack under different temperature environments; then confirming whether there are the occurrence of failure behaviors such as fracture, buckling and delamination of the testing optical stack; and finally, when it is confirmed that there are no occurrence of failure behaviors of the testing optical stack, judging the optical adhesive material as passing the bending test.

Hereinafter, an exemplary touch display device 1 according to the present invention is described with reference to FIG. 3. The touch display device 1 includes: a cover plate 131; a first adhesive layer 111; a circular polarizer component having a linear polarizer 132 and a half wave retarder 133; a second adhesive layer 112; a touch component 121 having a quarter wave retarder 135 and touch sensing electrodes 134 and 136 located on the upper and lower surfaces of the quarter wave retarder 135; a third adhesive layer 113; and a display component 122. For the consideration of testing cost, a layer of transparent polyimide film (Colorless PI, CPI) with a thickness of 50 μm is used as the display component 122, not a real organic light emitting diode display (OLED).

The cover plate 131 can be used as the outermost component of the touch display device 1, and can also be defined as a component accessible to the user. The cover plate 131 may be a single layer of inorganic packaging material, a multi-layer stack of inorganic packaging materials, or a stack of pairs of inorganic and organic packaging materials. The inorganic packaging material used is, for example, but not limited to, silicon nitride ($SiN_x$), silicon oxide ($SiO_x$), silicon oxynitride ($SiON_x$), aluminum oxide ($AlO_x$), titanium oxide ($TiO_x$), glass, or resin layer, etc. In this specific embodiment, the cover plate 131 is a transparent polyimide film (Colorless PI, CPI) with a thickness of 50 μm.

The circular polarizer component has essentially a linear polarizer and a phase retarder, which is often used as an anti-reflection sheet with the function of solving the problem of reflected light due to the incident light from the external environment. The problem of reflected light reduces the display performance. The phase retarder used may be a quarter wave plate (QWP) or a half wave plate (HWP). Theoretically, when the external incident light passes through the outermost linear polarizer, the linear polarizer converts the incident light into linearly polarized incident light, and the polarization direction of the linearly polarized incident light and the direction of the linear polarizer are vertical. Then, the linearly polarized incident light enters the quarter wave plate used as a phase retarder, such that a phase retardation of the linearly polarized incident light occurs, thereby converting the linearly polarized incident light into left-handed circularly polarized light. Next, after the light is reflected by the display panel, the light will be converted into a right-handed circularly polarized light in reverse direction and then pass through the quarter wave plate used as the phase retarder. Finally, the polarization direction of the linearly polarized incident light from the display panel is orthogonal to the polarization direction of the linearly polarized incident light from the environment, such that the incident light from the display panel cannot pass through the linear polarizer, and thus will not be observed by the human eye, thereby achieving an anti-reflection function. That is, the combination of the linear polarizer 132 and the half wave retarder 133 according to this embodiment can constitute an anti-reflection optical element. Wherein, the linear polarizer 132 is coupled to the cover plate 131 through the first adhesive layer 111, and the half wave retarder 133 is coupled to the touch component 121 through the second adhesive layer 112. More specifically, the half wave retarder 133 is a liquid crystal type phase retardation layer, which can be a single-layer liquid crystal coating. The phase retardation value $R_0$ (550) at 550 nm of the liquid crystal type phase retardation layer can range from 230 nm to 310 nm, preferably at least 250 nm. In this specific embodiment, the half wave retarder 133 is made of a commercially available product "Reactive Mesogen (RM)" reactive liquid crystal, which has a thickness of about 2 μm, a slow axis of about 15 degrees, and a phase retardation value at 550 nm of 260 nm, but the invention is not limited thereto. Furthermore, the linear polarizer 132 is the above-mentioned B-type polarization layer, which is a commercially available product SPN32-1805M (available from SAPO), and the liquid crystal type half wave retarder 133 is attached on the linear polarizer 132 through a polyvinyl alcohol (PVA)-based hydrogel.

In the touch component 121 of the present invention, transparent conductive materials such as indium tin oxide (ITO), metal mesh, silver nanowire (SNW), carbon nanotube (CNT), graphene, and conductive polymers like poly (3,4-ethylenedioxythiophene) (PEDOT) may be used to form touch sensing electrodes on the substrate through a patterning process. In the embodiment illustrated in FIG. 3, the touch component 121 has a quarter wave retarder 135 and touch sensing electrodes 134 and 136 located on the upper and lower surfaces of the quarter wave retarder 135. In other words, the quarter wave retarder 135 can be used as a carrier substrate/supporting substrate for the touch sensing electrodes 134 and 136, and the phase retardation value $R_0$ (550) at 550 nm of the quarter wave retarder 135 can range from 100 nm to 160 nm, preferably at least 130 nm. Specifically in this specific embodiment, the quarter wave retarder 135 is a cyclic olefin copolymer (Cyclo Olefin Polymer; COP) material (available from KONICA MINOLTA) with a thickness of 25 μm and a phase retardation value at 550 nm of 131 nm. In this embodiment, the touch component 121 is made of silver nanowires, and the method may be coating the upper and lower surfaces of the quarter wave retarder 135 with a dispersion containing silver nanowires. For example, the silver nanowires are dispersed into a solvent such as water, alcohol, ketone, ether, hydrocarbon or aromatic solvent (benzene, toluene, xylene, etc.) to form a coating material/slurry. Said coating material/slurry may also contain additives, surfactants or binders, such as carboxymethyl cellulose (CMC), 2-hydroxyethyl cellulose (HEC), hydroxypropyl methyl cellulose (HPMC), sulfonic acid ester, sulfuric acid ester, disulfonate, sulfosuccinic acid ester, phosphoric acid ester, or fluorine-containing surfactant, etc. After the coating is completed, the silver nanowire layer is formed by a curing step. This silver nanowire layer can then be used to form said touch electrodes 134 and 136 through a patterning method well-known in the art (for example, through a photolithography process utilizing photoresist as well as an etching process, etc.).

In an embodiment, the silver nanowire is formed on the surfaces of the polymer phase retardation layer without falling off, thereby forming a conductive layer of silver nanowires. The silver nanowires can be in contact with each other to provide a continuous current path, thereby forming a conductive network. In other words, the silver nanowires are in contact with each other at their intersections, thereby forming a path for transferring electrons. That is, one silver nanowire and another silver nanowire will form a direct contact at their intersection, thus forming an electron transferring path with low-resistance. In one embodiment, when the sheet resistance in a region or a structure is higher than $10^8$ ohms/square, it can be considered as electrical insulation, preferably in the situation that the sheet resistance is higher than $10^4$ ohm/square, 3000 ohm/square, 1000 ohm/square, 350 ohm/square, or 100 ohm/square. In one embodiment, the sheet resistance of the silver nanowire layer having the silver nanowires is less than 100 ohms/square. The silver nanowire electrode has a high transmittance, for example, the transmittance within the wavelength range of visible light is greater than about 88%, 90%, 91%, 92%, 93%, or more.

In one embodiment, a polymer layer may be further disposed such that the polymer layer covers the silver nanowires. In the specific embodiments, a suitable polymer is coated on the silver nanowires, and the polymer in flowing state/with flow property can infiltrate between the silver nanowires as filler. The silver nanowires will be embedded in the polymer, thereby a composite structure is formed after the polymer is cured. That is, in this step, the polymer is coated on the silver nanowires to adding a polymer layer on the silver nanowires, while the silver nanowires are embedded in the polymer layer to form a composite structure. In some embodiments of the present invention, the polymer layer is formed of an insulating material. For example, the material of the polymer layer can be a non-conductive resin or other organic materials, such as polyacrylate, epoxy resin, polyurethane, polysilane, silicone, poly(silicon-acrylic acid), polyethylene (PE), polypropylene (PP), polyvinyl butyral (PVB), polycarbonate (PC), acrylonitrile butadiene styrene (ABS), etc. In some embodiments of the present invention, the polymer layer may be formed by methods such as spin coating, spray coating, and printing. In some embodiments, the polymer layer has a thickness of about 20 nm to 10 mm, or 50 nm to 200 nm, or 30 nm to 100 nm. For example, the thickness of the polymer layer may be about 90 nm or 100 nm. The above-mentioned specific methods can be referred to references such as US20190227650A, CN101292362, the whole context of them can incorporated herein, and the silver nanowire slurry and the polymer coating material are both available from Cambrios.

Referring to Table 1 and FIG. 3, Table 1 illustrates the storage modulus of the adhesive layers 111, 112 and 113 made of the adhesive materials of Comparative Examples 1 and 2, and the results of bending test of the structure illustrated in FIG. 3 applying said adhesive layers 111, 112 and 113 at different temperatures, wherein the storage modulus is measured by performing dynamic load tests. Specifically, as shown in Table 1, a storage modulus at 60° C. of each of the adhesive materials of Comparative Examples 1 and 2 according to the present invention is over 30 kPa, and a ratio of a storage modulus at −30° C. to the storage modulus at 60° C. of each of the adhesive materials of Comparative Examples 1 and 2 is greater than 16. More specifically, a storage modulus at −30° C. of the adhesive material of Comparative Example 1 is 4000 kPa, a storage modulus at 60° C. of the adhesive layer 11 of Comparative Example 1 is 100 kPa, and a ratio of the storage modulus at −30° C. to the storage modulus at 60° C. of the adhesive layer 11 of Comparative Example 1 is up to 40. More specifically, a storage modulus at −30° C. of the adhesive material of Comparative Example 2 is 3800 kPa, a storage modulus at 60° C. of the adhesive material of Comparative Example 2 is 40 kPa, and a ratio of the storage modulus at −30° C. to the storage modulus at 60° C. of the adhesive material of Comparative Example 2 is up to 95.

TABLE 1

| | | Comparative Example 1 | Comparative Example 2 |
|---|---|---|---|
| Storage Modulus (G') | −30° C. | 4000 kPa | 3800 kPa |
| | −20° C. | 3800 kPa | 3800 kPa |
| | 25° C. | 550 kPa | 140 kPa |
| | 60° C. | 100 kPa | 40 kPa |
| G'(−30° C.)/G'(60° C.) | | 40 | 95 |
| Bending Test | −20° C. | FAIL | FAIL |
| | 25° C. | PASS | PASS |
| | 60° C. | FAIL | FAIL |

According the storage modulus of each of the adhesive layers of Comparative Examples 1 and 2 at high temperature (such as about 60° C.), it is obvious that the storage modulus of each of the adhesive materials of Comparative Examples 1 and 2 is excessively high at high temperature. The excessively high storage modulus means that the adhesive materials are relatively hard and their viscosities are decreased. Therefore, under the bending test at high temperature, the above-mentioned delamination/blistering phenomenon of the sample will occurs, which cannot meet the flexibility requirements for the product. As the temperature changes significantly, the optical stack is prone to be fragile under high and low temperature conditions due to the significant change in storage modulus, which causes a poor stability. According to Comparative Examples 1 and 2, it is found that when there is a significant change in the storage modulus, for example, the ratio of the storage modulus at about −30° C. to the storage modulus at about 60° C. of the adhesive material of Comparative Example 1 is up to 40, such that under a low temperature condition (such as about −30° C. to about −20° C.), the adhesive material will not be able to deform in response to bending, which cause the risk of fracture due to stress concentration, thereby causing the optical stack 100 to be broken, resulting in the risk such as mechanical damage or optical distortion (Mura). Therefore, according to the bending results of Comparative Examples 1 and 2 of the present invention, it is considered that it is necessary to find the suitable range of the storage modulus at 60° C. of the adhesive material and the suitable range of the ratio of the storage modulus at −30° C. to the storage modulus at 60° C., for satisfying the flexibility requirements of the products (e.g., the display touch product simulated in FIG. 3) under high and low temperature conditions. According to the bending results of Comparative Examples 1 and 2, the storage modulus at 60° C. of the adhesive material is preferably less than 40 kPa for meeting the requirements. According to the bending results of Comparative Examples 1 and 2, the ratio of the storage modulus at −30° C. to the storage modulus at 60° C. is preferably less than 40 for meeting the requirements.

Referring to Table 2 and FIG. 1, Table 2 illustrates the peel strengths of the adhesive materials according to Comparative Examples 1 and 2 measured in different interfaces. Specifically, as shown in Table 2, the peel strengths at −20° C. of the adhesive materials according to Comparative Examples 1 and 2 of the present invention are lower than 500 g/inch. More specifically, in Comparative Example 1, the peel strengths at −20° C. of the adhesive layer 11 with respect to the optical elements 13 (polarization layer and phase retardation layer) and the electrical signal processing element 12 (touch component) are only 175 g/inch, 127 g/inch, and 124 g/inch, respectively; and in Comparative Example 2, the peel strengths at −20° C. of the adhesive layer 11 with respect to the optical elements 13 (polarization layer and phase retardation layer) and the electrical signal processing element 12 (touch component) are only 122 g/inch, 349 g/inch, and 241 g/inch, respectively. It is obvious that under the low temperature condition, the adhesive layers 11 according to Comparative Examples 1 and 2 are not able to deform in response to bending, which causes the stress concentration, affecting the adhesive strength of the adhesive layer 11, thereby cannot maintain long-term reliable adhesions. From such data of peel strengths, it can explain the reason why the adhesive materials according to Comparative Examples 1 and 2 cannot pass the aforementioned bending test at low temperature. According to the peel strengths of Comparative Examples 1 and 2, the peel strengths at −20° C. of the adhesive layer 11 with respect to the optical elements 13 (polarization layer and phase retardation layer) and the electrical signal processing element 12 (touch component) are preferably larger than 349 g/inch for meeting the requirements.

TABLE 2

| Interface | Temperature | Comparative Example 1 (g/inch) | Comparative Example 2 (g/inch) |
|---|---|---|---|
| Polarization layer | −20° C. | 175 | 122 |
| Phase Retardation Layer | −20° C. | 127 | 349 |
| Touch Component | −20° C. | 124 | 241 |

Referring to Table 3 and FIG. 3, Table 3 illustrates the storage modulus of the adhesive layers 111, 112 and 113 made of the adhesive materials of Examples 1 to 3 of the present invention, and the results of bending test of the structure illustrated in FIG. 3 applying said adhesive layers 111, 112 and 113 at different temperatures, wherein the storage modulus is measured by performing dynamic load tests. Specifically, as shown in Table 3, a storage modulus at 60° C. of each of the adhesive materials of Examples 1 to 3 according to the present invention ranges from 15 kPa to 30 kPa, and a ratio of a storage modulus at −30° C. to the storage modulus at 60° C. of each of the adhesive materials of Examples 1 to 3 ranges from 6 to 16. More specifically, at the temperature of −30° C., a storage modulus of the adhesive material of Example 1 is 270 kPa, and thus Example 1 passes the bending test; at the temperature of 60° C., a storage modulus of the adhesive material of Example 1 is 17 kPa, and thus Example 1 passes the bending test; and a ratio of the storage modulus at −30° C. to the storage modulus at 60° C. of the adhesive material of Example 1 is 15.8. More specifically, at the temperature of −30° C., a storage modulus of the adhesive material of Example 2 is 371 kPa, and thus Example 2 passes the bending test; at the temperature of 60° C., a storage modulus of the adhesive material of Example 2 is 28 kPa, and thus Example 2 passes the bending test; and a ratio of the storage modulus at −30° C. to the storage modulus at 60° C. of the adhesive material of Example 2 is 13.3. More specifically, at the temperature of −30° C., a storage modulus of the adhesive material of Example 3 is 177 kPa, and thus Example 3 passes the bending test; at the temperature of 60° C., a storage modulus of the adhesive material of Example 3 is 27 kPa, and thus Example 3 passes the bending test; and a ratio of the storage modulus at −30° C. to the storage modulus at 60° C. of the adhesive material of Example 3 is 6.6.

TABLE 3

| | | Example 1 (3M, 3501) | Example 2 (3M, 3601) | Example 3 (Nitto, FL15) |
|---|---|---|---|---|
| Storage Modulus (G') | −30° C. | 270 kPa | 371 kPa | 177 kPa |
| | −20° C. | 106 kPa | 162 kPa | 93 kPa |
| | 25° C. | 29 kPa | 46 kPa | 37 kPa |
| | 60° C. | 17 kPa | 28 kPa | 27 kPa |
| G'(−30° C.)/G'(60° C.) | | 15.8 | 13.3 | 6.6 |
| Bending Test | −20° C. | PASS | PASS | PASS |
| | 25° C. | PASS | PASS | PASS |
| | 60° C. | PASS | PASS | PASS |

According to the ratio of the storage modulus of the adhesive materials of Examples 1 to 3 under the testing conditions, it is obvious that each of the storage modulus of the adhesive materials of Examples 1 to 3 won't significantly changes as the temperature changes under the testing conditions. In terms of stability, the adhesive layers 11 of the Examples 1 to 3 can maintain viscoelasticity and having excellent recoverability even within a wide temperature range, thereby achieving excellent stability. If the ratio G'(−30° C.)/G'(60° C.) is larger than 16, the storage modulus at −30° C. of the adhesive materials will be excessively high, such that the adhesive materials are relatively hard and their viscosities are decreased. On the other hand, in the present invention, it is considered that it is not the lower the better for the ratio G'(−30° C.)/G'(60° C.). Although a low storage modulus at −30° C. of the adhesive material helps the bending of the product, in fact, an excessively low storage modulus also means that the cohesion of the molecules inside the adhesive material and the degree of polymerization of the molecules are also very low. As a result, the strength of the adhesive material is excessively low, which is disadvantageous to processing. That is, the excessively low material strength is disadvantageous to the actual manufacturing process. Patent I590119 discloses the average slope of storage modulus at −20° C. to 80° C. and the storage modulus at respective temperatures, but does not disclose the storage modulus at −30° C., so that in the present invention, the analysis is performed by adopting interpolation/extrapolation commonly adopted in general experimental research. The ratios G'(−30° C.)/G'(60° C.) of nine specific Examples disclosed in Patent I590119 ranges from 2 to 4. Therefore, according to the foregoing discussion, there should be the defects that the adhesive materials have excessively low material strengths and are disadvantageous to processing in Patent I590119.

In addition, since Comparative Example 1 does not pass the bending test at 60° C., it is judged that the storage modulus at 60° C. of the adhesive layer should not be greater than 40 kPa. Further, according to Examples 1 to 3, it is found that when the storage modulus at 60° C. of the adhesive layer is lower than 30 kPa, the storage modulus of the adhesive material can be fully ensured to be low enough even under a high temperature environment, such that the optical stacks 100 of Examples 1 to 3 can pass the bending test under high temperature conditions, which ensures that these adhesive materials can still achieve long-term reliable adhesion even under high temperature environment. It should be further noted that, although a low storage modulus can ensure that the adhesive material deforms in response to bending, preventing the risk of fracture and breakage, however, when the storage modulus is excessively low, the adhesive material cannot maintain the cohesive strength necessary for processing, handling, shape retention and similar operations, resulting in difficulties in the manufacturing process for the adhesive materials. Therefore, summing up the data of Examples 1 to 3, the present invention provides a preferable specification for the adhesive material, wherein when the storage modulus at 60° C. of the adhesive material is within a range of 15 kPa to 30 kPa, it can be ensured that the adhesive material reaches a balance between cohesive strength and adhesive strength.

Referring to Table 4 and FIG. 1, Table 4 illustrates the peel strengths of the adhesive layers 11 according to Examples 1 to 3 of the present invention measured in different interfaces at different temperatures. Specifically, as shown in Table 4, the peel strengths at −20° C. of the adhesive materials according to Examples 1 to 3 of the present invention are all higher than 500 g/inch in different interfaces. More specifically, in Example 1, the peel strengths at −20° C. of the adhesive material with respect to the optical elements 13 (polarization layer and phase retardation layer) and the electrical signal processing element 12 (touch component) are 2812 g/inch, 2132 g/inch, and 1531 g/inch, respectively, and other data can be interpreted accordingly. According to the aforementioned bending test and the peel strengths shown in Table 4, it obvious that within the temperature range used, even when the peel strength between the adhesive material and other interfaces is higher than 500 g/inch, the adhesive material still maintains excellent reliability and durability. According to the peel strengths of Examples 1 to 3, the peel strengths at −20° C. of the adhesive layer 11 with respect to the optical elements 13 (polarization layer and phase retardation layer) and the electrical signal processing element 12 (touch component) are preferably larger than 1400 g/inch, more preferably larger than 1453 g/inch for meeting the requirements. According to the peel strengths of Examples 1 to 3, the peel strengths at 60° C. of the adhesive layer 11 with respect to the optical elements 13 (polarization layer and phase retardation layer) and the electrical signal processing element 12

(touch component) are preferably larger than 500 g/inch, more preferably larger than 528 g/inch for meeting the requirements.

TABLE 4

| Interface | Temperature | Example 1 (g/inch) | Example 2 (g/inch) | Example 3 (g/inch) |
| --- | --- | --- | --- | --- |
| Polarization layer | −20° C. | 2812 | 3151 | 2168 |
|  | 25° C. | 1278 | 1412 | 1307 |
|  | 60° C. | 792 | 867 | 689 |
| Phase Retardation Layer | −20° C. | 2132 | 2258 | 1982 |
|  | 25° C. | 876 | 855 | 768 |
|  | 60° C. | 575 | 663 | 659 |
| Touch Component | −20° C. | 1531 | 1616 | 1453 |
|  | 25° C. | 985 | 595 | 537 |
|  | 60° C. | 528 | 544 | 590 |

It can be understood that those skilled in the art can make various variations and adjustments based on the above examples, which will not be listed one by one herein. Hereinafter, it will focus on the application of the organic light emitting diode display with stable flexibility according to the embodiments, such that those skilled in the art can more clearly understand the possible variations. Elements denoted by the reference numerals same as those in the above-mentioned embodiments are substantially the same as those described above with reference to FIGS. 1 to 3. The elements, features, and advantages same as those of the above-mentioned optical stacks 11 will not be repeatedly described.

It should be further noted that, in this embodiment, the thicknesses of the first adhesive layer 111, the second adhesive layer 112, and the third adhesive layer 113 may range from 25 μm to 50 μm. Furthermore, the first adhesive layer 111, the second adhesive layer 112, and the third adhesive layer 113 may include adhesive films in which when the adhesive films have a thickness of 25 to 50 μm, the haze of the adhesive films is 5% or less, particularly 3% or less, and more particularly 1% or less. When the adhesive layer 11 is used for display within these ranges, it exhibits excellent transparency, but the present invention is not limited thereto.

In this embodiment, the first adhesive layer 111, the second adhesive layer 112, and the third adhesive layer 113 may be made of the same material. In the present invention, "the same material" means that the components and physical properties thereof are the same. In another embodiment, the first adhesive layer 111, the second adhesive layer 112, and the third adhesive layer 113 may be made of different materials. In another embodiment, the thicknesses of the second adhesive layer 112 may be greater than that of each of the first adhesive layer 111 and the third adhesive layer 113. Therefore, the second adhesive layer 112 may reach an adhesive extent higher than that of each of the first adhesive layer 111 and the third adhesive layer 113. Therefore, by adjusting the thickness of the adhesive layer 11, the reliability of the organic light emitting diode display can be increased, while the effects such as planarization of the optical elements can be achieved.

Finally, the technical features of the present invention and their achieved technical effects are summarized as follows:

First, for the optical stack 100 according to the present invention, a storage modulus at 60° C. of the adhesive material ranges from 15 kPa to 30 kPa, and a ratio of a storage modulus at −30° C. to the storage modulus at 60° C. of the adhesive material ranges from 6 to 16. According to this, it can be ensured that the adhesive layer 11 reaches an excellent balance between the cohesive strength and the adhesive strength, thereby the optical stack and its products can meet the actual application requirements.

Second, the peel strengths of the adhesive material of the optical stack 100 according to the present invention are higher than 500 g/inch in different interfaces at the used temperatures. Therefore, it is obvious that the adhesive layer 11 according to the present invention maintains excellent reliability and durability even in severe usage environment, storage environment and/or manufacturing environment, which meets actual application requirements.

The implementations of the present invention has been described with reference to the specific embodiments above, those skilled in the art can easily understand the technical features, advantages, and effects of the present invention from the present disclosure.

The above descriptions are only preferred embodiments of the present invention, but not intended to limit the scope of the present invention. Other equivalent changes and modifications made without departing from the spirit of the present invention should be included in the scope of the appended claims.

What is claimed is:

1. An optical stack, comprising:
    at least one adhesive layer, disposed between a cover plate and a circular polarizer component, between the circular polarizer component and a touch component, or between the touch component and a display component,
    wherein a storage modulus at 60° C. of the at least one adhesive layer ranges from 15 kPa to 30 kPa, and a ratio of a storage modulus at −30° C. to the storage modulus at 60° C. of the at least one adhesive layer ranges from 6 to 16, and wherein an interfacial adhesion between the at least one adhesive layer and the circular polarizer component is greater than 500 g/inch within a temperature range from −30° C. to 60° C.

2. The optical stack according to claim 1, wherein the storage modulus at 60° C. of the at least one adhesive layer is 27 kPa, and the ratio of the storage modulus at −30° C. to the storage modulus at 60° C. of the at least one adhesive layer is 6.6.

3. The optical stack according to claim 1, wherein the storage modulus at 60° C. of the at least one adhesive layer is 17 kPa, and the ratio of the storage modulus at −30° C. to the storage modulus at 60° C. of the at least one adhesive layer is 15.8.

4. The optical stack according to claim 1, wherein the storage modulus at 60° C. of the at least one adhesive layer is 28 kPa, and the ratio of the storage modulus at −30° C. to the storage modulus at 60° C. of the at least one adhesive layer is 13.3.

5. The optical stack according to claim 1, wherein a glass transition temperature of the at least one adhesive layer is lower than −30° C.

6. The optical stack according to claim 1, wherein the at least one adhesive layer is made of a material including a hydroxyl-containing acrylic-based polymer.

7. An organic light emitting diode display, comprising:
    a cover plate;
    a circular polarizer component;
    a touch component;
    a display component;
    a first adhesive layer disposed between the cover plate and the circular polarizer component;
    a second adhesive layer disposed between the circular polarizer component and the touch component; and a third adhesive layer disposed between the touch component and the display component,
wherein the cover plate is disposed at an uppermost layer of the organic light emitting diode display,
wherein a storage modulus at 60° C. of at least one of the first, second and third adhesive layers ranges from 15 kPa to 30 kPa,
wherein a ratio of a storage modulus at −30° C. to the storage modulus at 60° C. of at least one of the first, second and third adhesive layers ranges from 6 to 16.

8. The organic light emitting diode display according to claim 7, wherein the storage modulus at 60° C. of the at least one of the first, second and third adhesive layers is 27 kPa, and the ratio of the storage modulus at −30° C. to the storage modulus at 60° C. of the at least one of the first, second and third adhesive layers is 6.6.

9. The organic light emitting diode display according to claim 7, wherein the storage modulus at 60° C. of the at least one of the first, second and third adhesive layers is 17 kPa, and the ratio of the storage modulus at −30° C. to the storage modulus at 60° C. of the at least one of the first, second and third adhesive layers is 15.8.

10. The organic light emitting diode display according to claim 7, wherein the storage modulus at 60° C. of the at least one of the first, second and third adhesive layers is 28 kPa, and the ratio of the storage modulus at −30° C. to the storage modulus at 60° C. of the at least one of the first, second and third adhesive layers is 13.3.

11. The organic light emitting diode display according to claim 7, wherein a glass transition temperature of the at least one of the first, second and third adhesive layers is lower than −30° C.

12. An optical stack, comprising:
at least one adhesive layer, disposed between a cover plate and an optical component, between the optical component and a touch component, or between the touch component and a display component,
wherein a storage modulus at 60° C. of the at least one adhesive layer ranges from 15 kPa to 30 kPa, and a ratio of a storage modulus at −30° C. to the storage modulus at 60° C. of the at least one adhesive layer ranges from 6 to 16, and wherein an interfacial adhesion between the at least one adhesive layer and the optical component is greater than 500 g/inch within a temperature range from −30° C. to 60° C.

13. The optical stack according to claim 12, wherein the storage modulus at 60° C. of the at least one adhesive layer is 27 kPa, and the ratio of the storage modulus at −30° C. to the storage modulus at 60° C. of the at least one adhesive layer is 6.6.

14. The optical stack according to claim 12, wherein the storage modulus at 60° C. of the at least one adhesive layer is 17 kPa, and the ratio of the storage modulus at −30° C. to the storage modulus at 60° C. of the at least one adhesive layer is 15.8.

15. The optical stack according to claim 12, wherein the storage modulus at 60° C. of the at least one adhesive layer is 28 kPa, and the ratio of the storage modulus at −30° C. to the storage modulus at 60° C. of the at least one adhesive layer is 13.3.

16. The optical stack according to claim 12, wherein a glass transition temperature of the at least one adhesive layer is lower than −30° C.

17. The optical stack according to claim 12, wherein the at least one adhesive layer is made of a material including a hydroxyl-containing acrylic-based polymer.

18. The optical stack according to claim 12, wherein the cover plate is a single layer of an inorganic packaging material, a multi-layer stack of inorganic packaging materials, or a stack of at least one inorganic material and at least one organic packaging material.

* * * * *